United States Patent [19]

Hussmann et al.

[11] Patent Number: 5,284,448
[45] Date of Patent: Feb. 8, 1994

[54] ELECTRICAL DEVICE, IN PARTICULAR A SWITCHING AND CONTROL UNIT FOR MOTOR VEHICLES

[75] Inventors: Dieter Hussmann, Steinheim; Thomas Jessberger, Eberdingen/Hochdorf; Dieter Karr, Tiefenbronn; Gerhard Klein, Gifhorn-Gamsen, all of Fed. Rep. of Germany

[73] Assignee: Robert Bosch GmbH, Stuttgart, Fed. Rep. of Germany

[21] Appl. No.: 956,888

[22] PCT Filed: May 27, 1991

[86] PCT No.: PCT/DE91/00446
§ 371 Date: Dec. 14, 1992
§ 102(e) Date: Dec. 14, 1992

[87] PCT Pub. No.: WO91/20177
PCT Pub. Date: Dec. 26, 1991

[30] Foreign Application Priority Data

Jun. 20, 1990 [DE] Fed. Rep. of Germany ....... 4019570

[51] Int. Cl.⁵ .............................................. H01R 13/74
[52] U.S. Cl. ................................... 439/544; 439/550; 439/559

[58] Field of Search ............... 248/27.3; 439/544, 550, 439/556, 559, 562, 563, 571, 574

[56] References Cited

U.S. PATENT DOCUMENTS

3,553,967  1/1971  Porter et al. ...................... 248/27.3
5,139,431  8/1992  Saitoh et al. ...................... 439/559 X

FOREIGN PATENT DOCUMENTS

650076  10/1962  Canada ................................. 439/550
1297725  6/1969  Fed. Rep. of Germany .
2530396  1/1984  France .

Primary Examiner—Eugene F. Desmond
Attorney, Agent, or Firm—Michael J. Striker

[57] ABSTRACT

In an electrical switching or control unit, several components are arranged, sealed, within a housing (24). A plug body (10) is accommodated in an aperture (14) of a collar-like front plate (13) which itself is fixed to the edge of the housing (24). The connection between the plug body (10) and the front plate (13) is made by an locking cam (21) which is inserted in grooves (18, 19) which are opposite each other in the front plate (13) and the plug body (10) and which is fixed in its position by the housing (24).

4 Claims, 1 Drawing Sheet

ELECTRICAL DEVICE, IN PARTICULAR A SWITCHING AND CONTROL UNIT FOR MOTOR VEHICLES

BACKGROUND OF THE INVENTION

The present invention relates to an electrical device and, more particularly, to a switching and control unit for a motor vehicle.

The invention is based on an electrical device comprising a housing with a front plate provided with an aperture and a collar portion bordering the aperture; and a plug body having a front face and plug parts or pins arranged on its front face and insulated from each other. The plug body projects through the aperture surrounded by the collar and is fixed to the collar.

In an electrical device of this type known from the DE-OS 33 10 477, a plug body is screwed in a collar-like front plate, with a seal arranged between the front plate and the plug body. The front plate and the screw-connected plug body are connected to a housing by snap-in devices. A seal is also inserted between the housing edge and the front plate. This electrical unit has the disadvantage that sealing problems occur at the screw connections between the front plate and the plug body, which are not influenced by the inserted seals between the front plate and the plug body or between the housing edge and the front plate.

SUMMARY OF THE INVENTION

It is an object of the present invention to provide an electrical device, particularly a switching and control unit for a motor vehicle, which does not have the above-described disadvantage of the prior art device.

This object, and others which will be made more apparent hereinafter, is attained in an electrical device, particularly a switching and control unit for a motor vehicle, comprising a housing with a front plate provided with an aperture and, advantageously a collar portion bordering the aperture; and a plug body having a front face and plug parts arranged on its front face and insulated from each other. The plug body projects through the aperture surrounded by the collar and is fixed to the collar.

According to the invention, the electrical device further comprises cam means, advantageously a locking cam, for fixing the plug body to the front plate. The front plate and the plug body are provided with opposing grooves and the cam means is insertable into the opposing grooves to connect the front plate and the plug body. The front plate and the plug body can be inserted into the housing when the locking cam is fully inserted into the opposing grooves and, when the front plate and the plug body so connected with the locking cam in the fully inserted position are inserted in the housing, the locking cam is fixed in position by the housing.

In a preferred embodiment of the invention, cam means comprises a locking cam which is advantageously U-shaped and has a wedge-shaped tooth at a free end of each U-leg.

In contrast, the electrical device in accordance with the invention has the advantage that the connection between the plug body and the front plate can be adequately sealed by means of a seal, since the connection is made without any holes going through to the outside. Using the wedge shaped region of the teeth of the locking cam, it is possible to effect a secure and tight connection with very little physical effort and with minor mounting effort in comparison to the screw connection.

BRIEF DESCRIPTION OF THE DRAWING

The objects, features and advantages of the present invention will now be illustrated in more detail by the following detailed description, reference being made to the accompanying drawing in which.

DETAILED DESCRIPTION OF A PREFERRED EMBODIMENT

Figure 1:
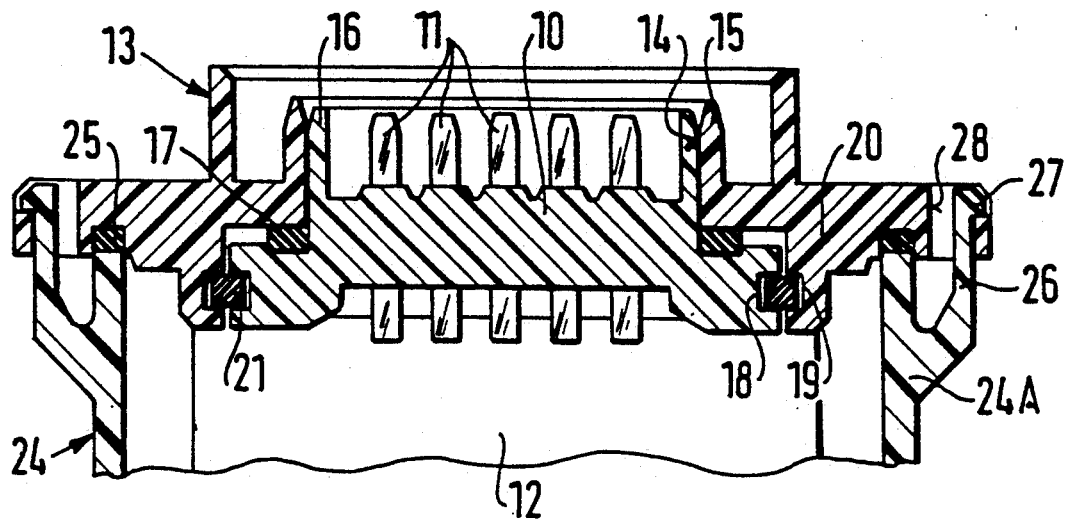
FIG. 1 is a longitudinal cross-sectional view through an electrical device according to the invention showing the plug body and the front plate fixed to each other.

A plug body 10 is shown in FIG. 1. A number of flat pins 11, which are sealed and insulated from each other, are imbedded in the plug body 10, and the inner ends of these flat-pins are connected to a printed circuit board 12. A front plate 13 has a collar portion 15 and is provided with an aperture 14, which is bordered by the collar portion 15. This aperture 14 accommodates the plug body 10 with an appropriately designed collar 16.

Figure 2:
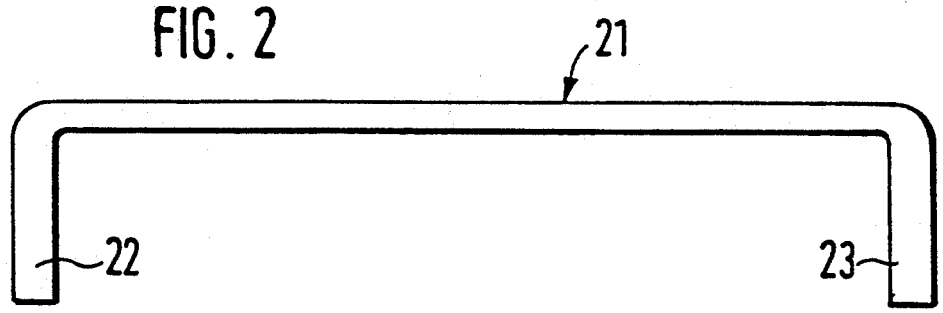
FIG. 2 is a top plan view of a locking cam for making the connection shown in FIG. 1.
Figure 3:
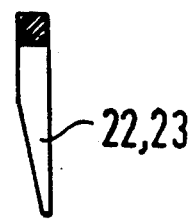
FIG. 3 is a cutaway side view of one of the wedge-shaped teeth of the locking cam shown in FIG. 2.

A seal 17 is arranged between the plug body 10 and the front plate 13 closer to the collar 16. A groove 18 is provided in the outer edge of the plug body 10, opposite which is a corresponding groove 19 in an inner collar part 20 of the front plate 13. A locking cam 21, the teeth 22, 23 of which are of wedge shape, is inserted into these grooves 18, 19 which face each other, as shown in FIGS. 2 and 3. The wedge shaped design of the teeth 22, 23 causes the pre-assembled seal 17 to be pressed between the front plate 13 and the plug body 10 and thus seals the aperture 14 in the front plate 13. Full insertion of the comb 21 effects a near positive connection of the two components 10 and 13.

The thus connected assembly comprising the front plate 13, the locking cam 21 and the plug body 10 is pushed into the control unit housing 24. The locking cam 21 is structured so that this is only possible when the comb 21 is fully pushed into the grooves 18, 19. At the same time, the locking cam 21 is fixed in its position after insertion of the connected assembly into the housing 24.

A seal 25 is arranged between the housing edge 24A and the front plate 13 which prevents the ingress of dirt and moisture. The connection between the front plate and the housing can be made as shown, for example, by snap-type tongues 26 with noses 27 directed outward, which are provided on the housing edge 24A and engage in appropriate recesses 28 in the front plate.

While the invention has been illustrated and described as embodied in an electrical device, particularly a switching and control unit for motor vehicles, it is not intended to be limited to the details shown in the examples, since various modifications and compositional changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and desired to be protected by Letters Patent is set forth in the appended claims:

1. An electrical device, particularly a switching and control unit for a motor vehicle, comprising a housing having a front plate provided with an aperture; and a plug body having a front face and a plurality of plug parts arranged on the front face and insulated from each other, the plug body projecting through the aperture in the front plate and being fixed to the front plate; and cam means for fixing the plug body to the front plate, the front plate and the plug body being provided with opposing grooves for receiving the cam means, wherein the cam means and the opposing grooves are structured and positioned so that said cam means is insertable into the opposing grooves to fix the plug body to the front plate and the front plate and the plug body are insertable into the housing with the cam means in a fully inserted position in the opposing grooves and, when the front plate and the plug body so connected with the cam means in the fully inserted position are inserted in the housing, the locking cam is secured in the opposing grooves by the housing.

2. Electrical device as defined in claim 1, wherein said cam means is a locking cam provided with two wedge-shaped teeth for insertion in said opposing grooves.

3. Electrical device as defined in claim 1, further comprising a seal located between the front plate and the plug body.

4. Electrical device as defined in claim 3, wherein said front plate has a collar portion surrounding said aperture and said seal is provided in the vicinity of said collar portion.

* * * * *